United States Patent [19]

Huang

[11] Patent Number: 5,172,471
[45] Date of Patent: Dec. 22, 1992

[54] METHOD OF PROVIDING POWER TO AN INTEGRATED CIRCUIT

[75] Inventor: Chin C. Huang, San Jose, Calif.

[73] Assignee: VLSI Technology, Inc., San Jose, Calif.

[21] Appl. No.: 718,524

[22] Filed: Jun. 21, 1991

[51] Int. Cl.[5] .............................................. H05K 3/34
[52] U.S. Cl. ........................................ 29/840; 29/827; 174/52.4
[58] Field of Search ................... 174/52.4; 29/827, 840

[56] References Cited

U.S. PATENT DOCUMENTS

| | | |
|---|---|---|
| 3,408,542 | 10/1968 | Dautzenberg et al. |
| 3,535,530 | 10/1970 | Cooper et al. |
| 3,745,487 | 7/1973 | Miland et al. |
| 3,786,375 | 1/1974 | Sato et al. |
| 4,023,198 | 5/1977 | Malone et al. |
| 4,117,508 | 9/1978 | Koenig |
| 4,128,802 | 12/1978 | Gansert et al. |
| 4,514,587 | 9/1985 | Soerewyn |
| 4,926,545 | 5/1990 | Pimpinellon et al. |

OTHER PUBLICATIONS

Reduced Ground Bounce and Improved Latch-Up Suppression Through Substrate Conduction by T. Gabara, IEEE Journal of Solid-State Circuits, vol. 23, No. 5, pp. 1224, 1232, Oct. 1988.

Primary Examiner—Carl J. Arbes
Attorney, Agent, or Firm—Hickman and King

[57] ABSTRACT

A CMOS integrated circuit assembly for providing reduced power supply and ground inductances has a first conducting layer which is formed over an insulating layer formed on top of the integrated-circuit chip. The first conducting layer is connected to wire bond pads which are wirebonded to a package. This first conducting layer forms a single, low-inductance conductor for a VDD supply voltage and extends over a substantial area so that it has an inductance significantly less than the inductance of a conventional conductor. A second conducting layer is forms a low-inductance VSS conductor. Power can be selectively distributed through conductive layers of this to provide power supply isolation between selected circuits of the integrated circuit.

6 Claims, 8 Drawing Sheets

METHOD OF PROVIDING POWER TO AN INTEGRATED CIRCUIT

BACKGROUND OF THE INVENTION

1. Field of the Invention

This invention relates to packaging techniques for integrated circuits and, more particularly, to packaging techniques which minimize the number of bonding pads and package pins used for power and ground conductors without degrading ground bounce and conducted power supply noise performance. This invention also relates to packaging techniques for distribution of power to an integrated circuit and for supplying separate power supplies to for core and peripheral areas of an integrated circuit.

2. Prior Art

To suppress noise due to ground bounce and to suppress noise conducted through the power supply leads of a packaged CMOS integrated circuit, the inductances in the VDD and VSS conductors, that is, the power and ground conductors for a packaged CMOS integrated-circuit, need to be decreased.

Conventional integrated circuit assemblies include an integrated-circuit die, or chip, which is fabricated and later mounted into a package. The package includes a number of pins which are adapted to connect to sockets, circuit boards, and the like. Connections between the integrated-circuit die and the package are made by various wire-bonding techniques. To provide power and ground to a CMOS chip in a conventional pin-grid-array (PGA) package, the base of the PGA package itself includes a VSS ground plane and a VDD power supply plane. Conductive vias are provided through the base of the PGA package to provide connections between the chip and these VSS and VDD planes in the package. Wire bonding is used to connect bonding pads on the chip to the top surface of the conductive vias in the package. These bonding wires have significant inductance values which affect the noise suppression performance of a packaged chip.

A conventional technique for reducing the inductance associated with the power conductors and with the ground conductors for an integrated circuit is to use a large number of additional bonding wires in parallel. These additional parallel bonding wires require a number of additional bonding pads on the integrated circuit chip and a number of additional external connection pins for the package. A disadvantage of this technique is the increase in cost of the packaged integrated circuit due to the increased die size for the additional bonding pads and the increased number of package pins.

Another technique for reducing lead inductance uses so-called "flip-chips." A flip-chip is an integrated circuit chip which has a conductive layer formed on its top surface for supplying VSS and VDD power through appropriately placed vias to the underlying integrated circuit. Also formed on the top of the flip-chip are a number of "solder bumps". The package for a flip chip has two conductive layers formed in the base of the package for providing VSS and VDD power through vias to the top surface of the package. When the chip and the package are assembled together, the chip is flipped upside down so that the solder bumps engage with contact areas on the top surface of the package. The chip and package assembly is then heated to cause the solder bumps to connect the chip to the package. The flip chip package is very expensive because it requires two conductive layers. In comparison with wire-bonding assembly techniques, the flip chip technique of assemblying a chip and a package is more difficult to control than is wirebonding.

Reduction of ground bounce is addressed in an article in the *IEEE Journal of Solid-State Circuits, Vol.* 23, *No.* 5, *October* 1988, titled "Reduced Ground Bounce and Improved Latch-Up Suppression Through Substrate Conduction" by T. Gabara. This article discusses a technique for reducing lead inductances. The technique utilizes an epitaxially deposited conducting substrate which is formed on the back side of a semiconductor die as a VSS conductor plane in order to reduce the number of bonding pads on the die and the number of pins in the package. This technique is limited to reducing the number of power and ground pins in a package by 40–50 percent. Providing a VSS conductor plane on a semiconductor wafer with an epitaxially deposited layer is more expensive and requires more complicated processing than does a standard wafer.

Consequently, the need exists for a cost-effective technique to maintain the noise performance of a semiconductor integrated circuit while reducing the number of power and ground bonding pads on the integrated circuit to thereby reduce the die size to provide cost savings. Reducing the number of bonding pads results in a reduced number of power and ground pins for the package, which provides an additional number of I/O pins for additional I/O signals or which provides an reduction in the silicon area used by an integrated circuit. It would be advantageous if improved performance was obtained while still using wirebonding techniques and without having to resort to more expensive packaging techniques such as flip chips, multilayer tape-automated-bonding, etc.

SUMMARY OF THE INVENTION

It is therefore an object of the invention to provide an improved method and apparatus for reducing the number of power and ground pins for an integrated circuit while maintaining certain performance characteristics, such as ground bounce and power supply conducted noise at an acceptable level.

It is another object of the invention to provide a technique for selectively distributing and isolating power to certain selected areas of an integrated circuit.

In accordance with these and other objects of the invention, an integrated circuit assembly and method is provided which includes a semiconductor substrate on which various integrated circuit elements and various interconnection conductors are formed. A top insulating layer is formed on at least a portion of the top surface of the semiconductor substrate. A first conducting voltage-reference layer is formed on the top insulating layer for supplying a VSS voltage to the integrated circuit. This first conducting voltage-reference layer has lateral dimensions which are significantly greater than the line width of one of the conventional interconnection conductors formed on a semiconductor substrate. This first conducting voltage-reference layer forms a single conductor which extends over a substantial area of the semiconductor substrate and has an inductance significantly less than the inductance of one of the conventional interconnection conductors.

In one embodiment of the invention, a second conducting voltage-reference layer is formed as part of the package for the integrated circuit. This second conducting voltage-reference layer is used for supplying VSS. It also has lateral dimensions significantly greater than the line width of the connection conductors formed on the semiconductor substrate and also extends over a substantial area of the semiconductor substrate.

The invention provides a method of distributing power to an integrated circuit. An insulating layer is formed on at least a portion of a semiconductor die, on which a plurality of wirebonding pads are formed. A power-distribution conducting layer is formed on the insulating layer where the conducting layer has lateral dimensions significantly greater than the line width of a signal conductor formed on the semiconductor die. The conducting layer is formed as a single conducting region which is connected to one or more wirebonding pads on the semiconductor die. The conducting layer provides a connection for a voltage reference source to a selected region of the integrated circuit. The semiconductor die is mounted in a wirebond package and the external connection pins of the package are electrically connected by wirebonds to wirebond pads on the semiconductor die. Conductive vias connect the conducting layer to points within the circuits formed on the semiconductor die.

A second conducting layer is formed on the insulating layer and provides a connection for a second voltage reference source to a second selected region of the integrated circuit.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
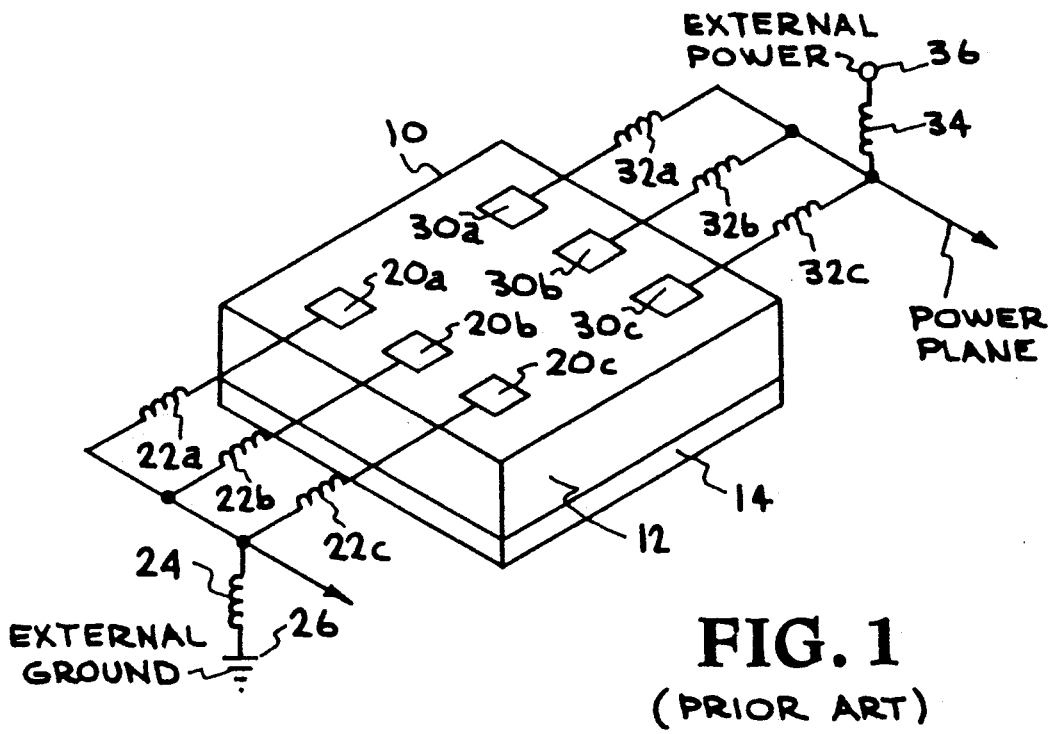
FIG. 1 diagrammatically illustrates a conventional, prior-art technique for integrated-circuit noise reduction which uses a significant number of parallel bonding wires, pads, and pins.

FIG. 1 diagrammatically illustrates a conventional, prior-art technique for ground bounce noise reduction and/or control within an acceptable range for a CMOS integrated-circuit chip 10, which is designed to be packaged in a pin-grid-array PGA package (not shown). The chip is fabricated on a semiconductor substrate 12. The chip is then fixed to the package with a metallization layer 14. Within the base of a high performance PGA package are contained conductive planes, one for VDD and one for VSS or ground. Conductive vias are provided through the base of the PGA package to provide connections between the chip and these VSS and VDD planes in the package. Wire bonding is used to connect bonding pads on the chip to the top surface of the conductive vias in the package. These bonding wires have significant inductance values which affect the noise suppression performance of a packaged chip. Even if the VDD and VSS planes in the package have low inductance, the interconnections between the package and the chip are still made with high-inductance bonding wires.

Long conductor lengths in the various conductors on the chip and within the package and pins have increased inductance and resistance which increases ground bounce and conducted power-supply noise when the various devices within the integrated circuit are switched. Therefore, it is desirable to have the inductances and resistances for these conductors reduced in value as much as possible. One technique for reducing inductance and resistance is to use a number of conductors in parallel as illustrated in FIG. 1.

The prior art technique illustrated in FIG. 1 uses a number of bonding pads for the VSS reference-voltage, where the bonding pads are representatively shown as 20A, 20B, and 20C. Each of the respective bonding pads has a parallel bonding wire fixed thereto, where the inductances of each of the respective bonding wires are respectively represented by 22A, 22B, and 22C. Several of these bonding wires are commonly connected to a package pin, where the inductance of the package pin is represented by 24. A number of these combinations of bonding pads and package pins are used to reduce the effective inductance of power and ground conductors. For the VSS reference-voltage, the package pin is connected to an external ground reference terminal 26.

The prior art technique illustrated in FIG. 1 also uses a number of bonding pads 30A, 30B, and 30C for the VDD reference-voltage. Each of these respective bonding pads has a parallel bonding wire fixed thereto, where the inductances of each of the respective wires are respectively represented by 32A, 32B, and 32C. Several of these bonding wires are commonly connected to a package pin, where the inductance of the package pin is represented by 34. For the VDD reference-voltage, the package pin is connected to an external VDD power terminal 36.

While only three bonding pads are shown for purposes of illustration, a much greater number of bonding pads are employed in various prior art designs. For example, the equivalent circuit of a 299 pin integrated circuit in a high-performance package employs 21 bonding pads and 21 pins each for both VSS and VDD connections.

Figure 2:
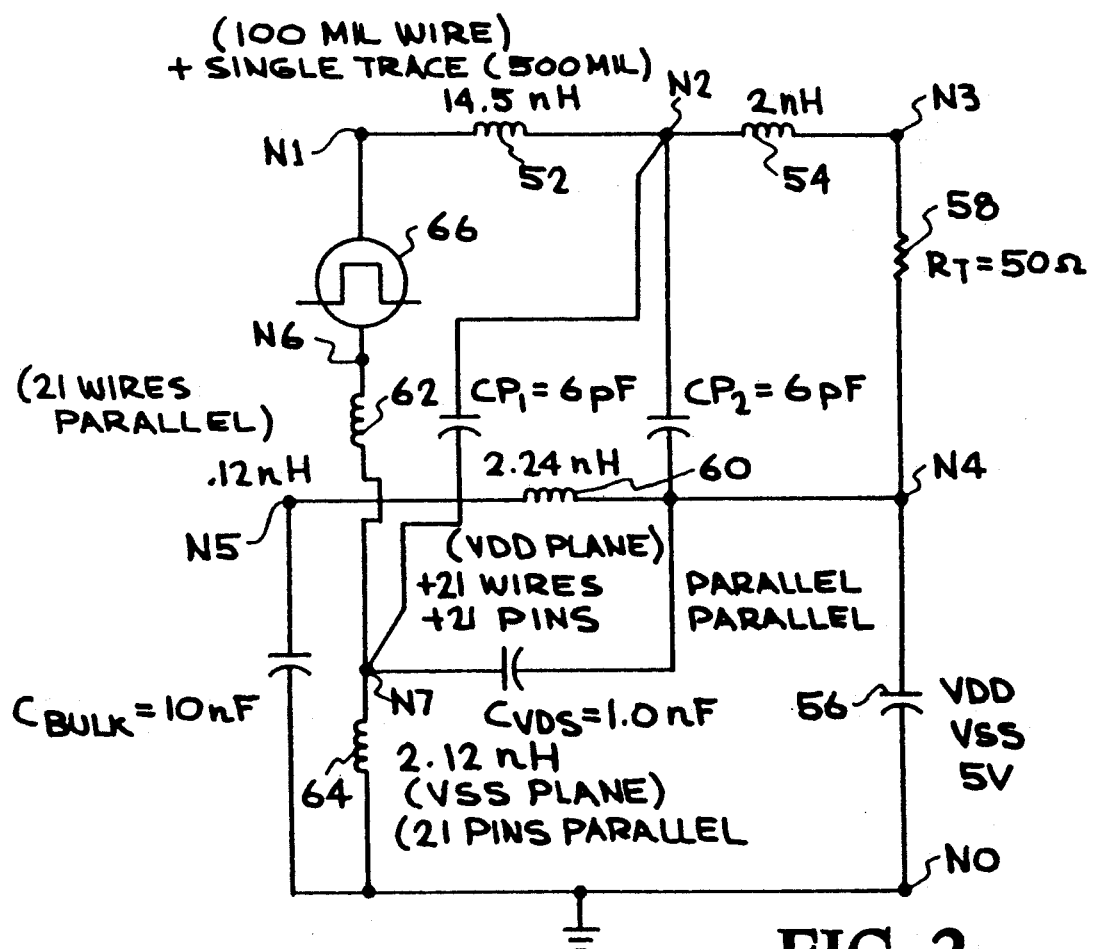
FIG. 2 shows the equivalent circuit for a CMOS integrated circuit packaged in a conventional, prior-art 299-pin HPCPGA package, which uses 42 pins for VDD/VSS connections.

FIG. 2 shows a simulation equivalent circuit model for a conventional, prior-art 299-pin high performance HPCPGA package, which altogether uses 21 package pins for VSS connections and 21 pins for VDD connections for a combined total of 42 pins being used for VDD/VSS connections. For test purposes, a packaged chip is mounted to a circuit board.

With reference to FIG. 2, Node N0 represents the VSS or ground terminal on the circuit board. Node N1 represents the bonding pad on the chip for an output test signal. Node N2 represents the bonding pad on the package for the output signal. An inductance 52, having a value of 14.5 nanohenrys, is connected between nodes N1 and N2 and represents the inductance of a 100 mil bonding wire and a single 500 mil wire trace on the chip. Node N3 represents the circuit board terminal to which a package pin for the integrated circuit is connected. An inductance 54, having a value of 2 nanohenrys, is connected between nodes N2 and N3 and represents the inductance of a package pin. Node N4 represents the connection terminal of the package to the circuit board for the nominal 5 volt VDD voltage provide by an external voltage source 56, which is connected between node N4 and the external ground node N0. For test purposes a 50 ohm test resistor 58 is shown connected between nodes N3 and N4.

Node N5 represents the bonding pads for VDD on the chip. An inductance 60, having a value of 2.24 nanohenrys, is connected between the nodes N4 and N5 and represents the inductance of the VDD plane in the base of the PGA package plus 21 parallel VDD package pins and 21 parallel bonding wires.

Node 6 represents the VSS, or chip ground, circuit connections on the chip. Node 7 represents the VSS bonding pads on the chip. An inductance 62 is connected between the Nodes N6 and N7 and represents 21 parallel bonding connection wires. An inductance 64 is connected between the VSS Node N7 and the external ground node N0 and represents the inductance of the VSS plane in the base of the PGA package plus 21 parallel VSS package pins.

Various capacitances for this prior art chip and package assembly are also shown in FIG. 2. CP1 has a value of 6 picofarads and represents the coupling capacitance between nodes N2 and N7, that is, the capacitance between the bonding pads for the test signal and the VSS bonding pads. CP2 has a value of 6 picofarads and represents the coupling capacitance between nodes N2 and N4, that is, the capacitance between the bonding pads on the chip for the test signal and the VDD connection to the circuit board. CBULK has a value of 10 nanofarads and represents the value of the chip substrate capacitance. CVDS has a value of 1 nanofarad and represents the value of the couplig capacitance between the VDD connection to the circuit board and the VSS pads on the chip.

To test the equivalent circuit of this integrated circuit and package configuration by simulation, a test pulse is applied with a pulse generator 66, which is connected between nodes N1 and N6, that is, between the chip output bonding pad for the test signal and the VSS bonding pads on the chip.

Figure 3A:
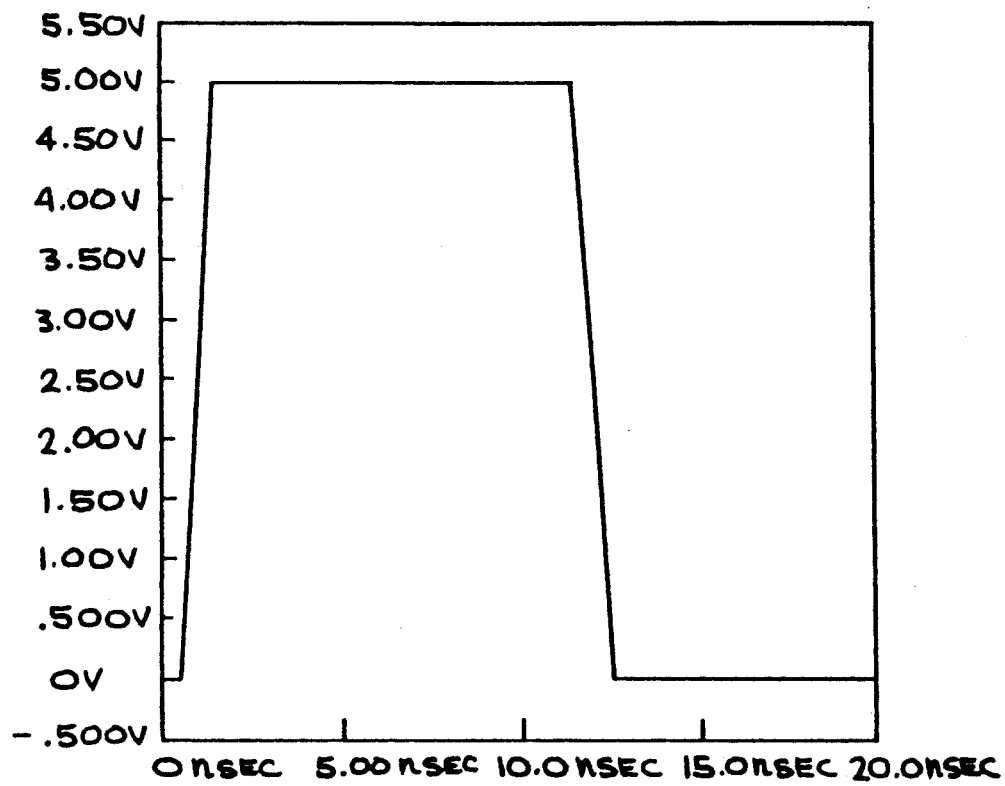
FIG. 3A shows a simulated input pulse having a one nanosecond risetime and falltime for testing the equivalent circuit of FIG. 2.

FIG. 3A shows a simulated test input pulse from the pulse generator 66. The test pulse has a five volt amplitude, a 10 nanosecond pulse width, a one nanosecond risetime, and a falltime for testing and evaluating the ground bounce performance characteristics of the circuit of FIG. 2.

Figure 3B:
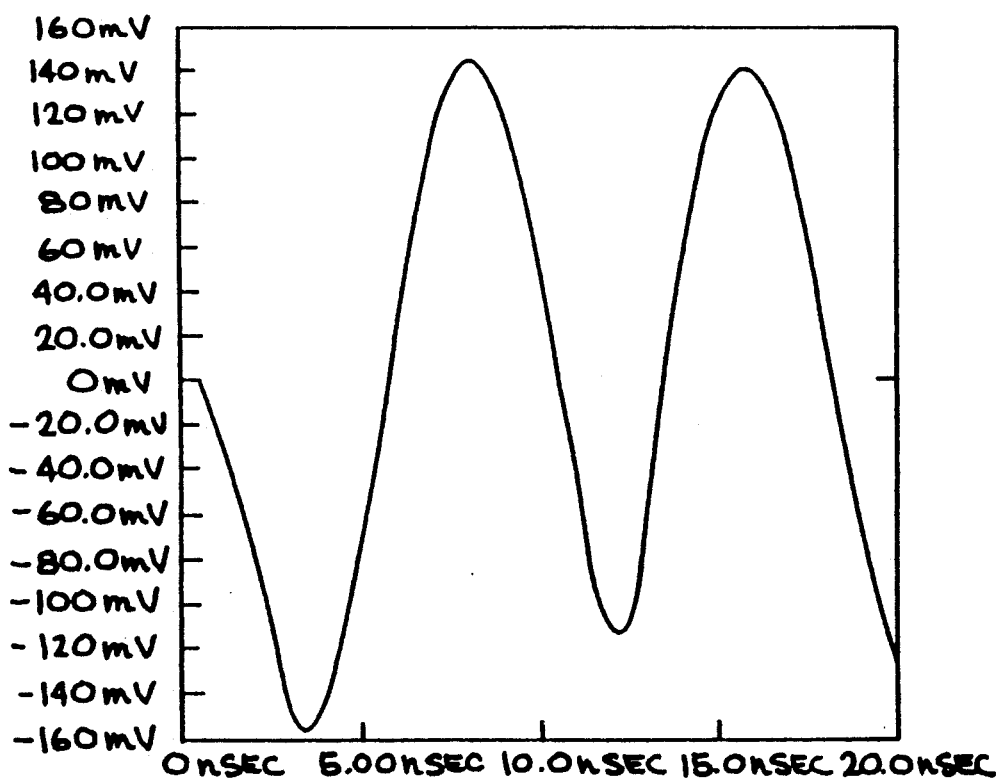
FIG. 3B shows a simulated ground-bounce voltage response at node 7(N7) for the simulated input pulse of FIG. 3A.

FIG. 3B shows the ground bounce noise at nodes N6 for the input test pulse of FIG. 3A. The peak voltage excursions are approximately 160 millivolts negative and approximately 140 millivolts positive, which provides a groundbounce noise characteristic of less than 5 percent for a five volt test pulse.

Figure 4:
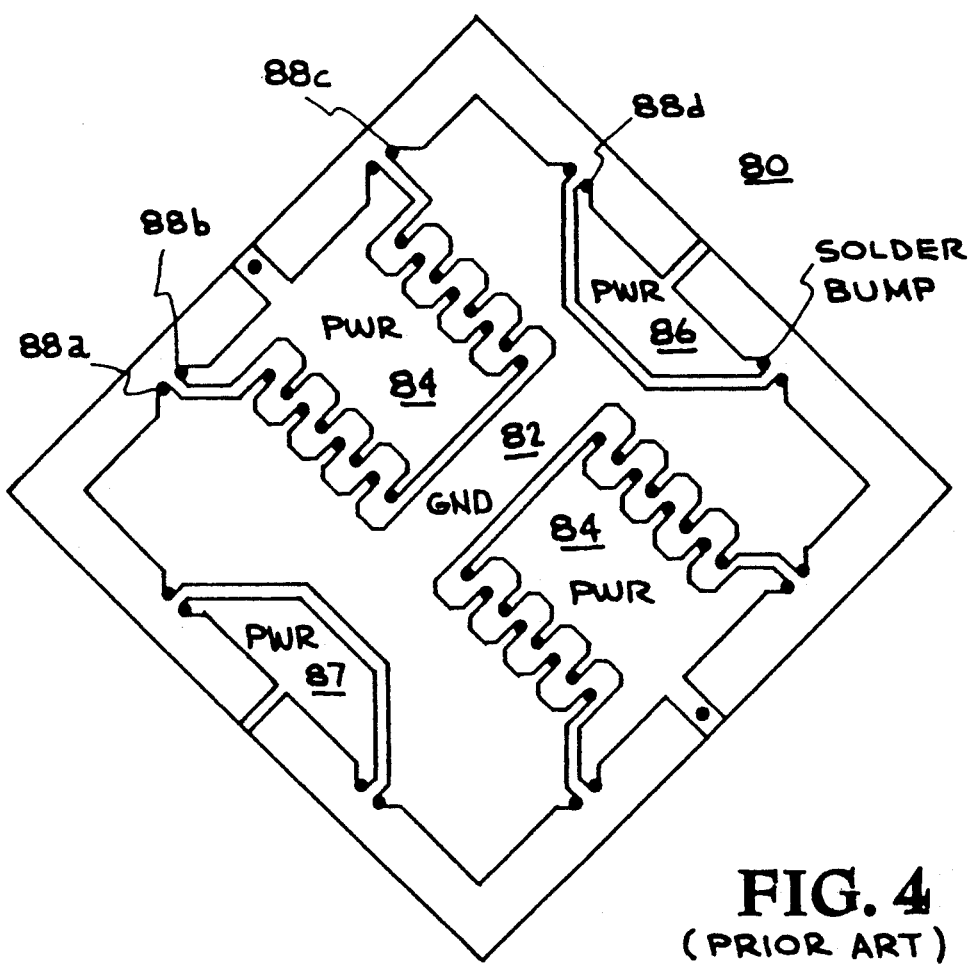
FIG. 4 shows a top view of a prior art flip-chip integrated circuit.

FIG. 4 illustrates a so-called "flip-chip" technique for making connections to an integrated circuit. A flip-chip integrated-circuit 80 is an integrated circuit chip which has relatively large conductive regions formed on its top surface. As illustrated in the drawing, a ground region 82 of the layer provides a ground connection to the integrated circuit through appropriately located vias. Similarly, as illustrated in the drawing, various power regions 84, 85, 86, 87 provide power connections to the integrated circuit through appropriately located vias. A number of solder bumps, which are illustrated as large, dark dots (typically shown as 88a, 88b, 88c, 88d) provide connections to the package for the flip chip. The package for a flip chip has two conductive layers formed in its base for providing power and ground. Vias connect these conductive layers in the package to the top surface of the package. When a flip chip and its package are assembled together, the chip is flipped upside down so that the solder bumps, typically illustrated as 88a, 88b, 88c, 88d, engage with contact areas on the top surface of the package. The assembly is then heated so that the solder bumps are bonded to the contact areas of the package. In comparison with wire-bonding assembly techniques, the flip chip technique of assemblying a chip and a package is more expensive and difficult to control.

Figure 5:
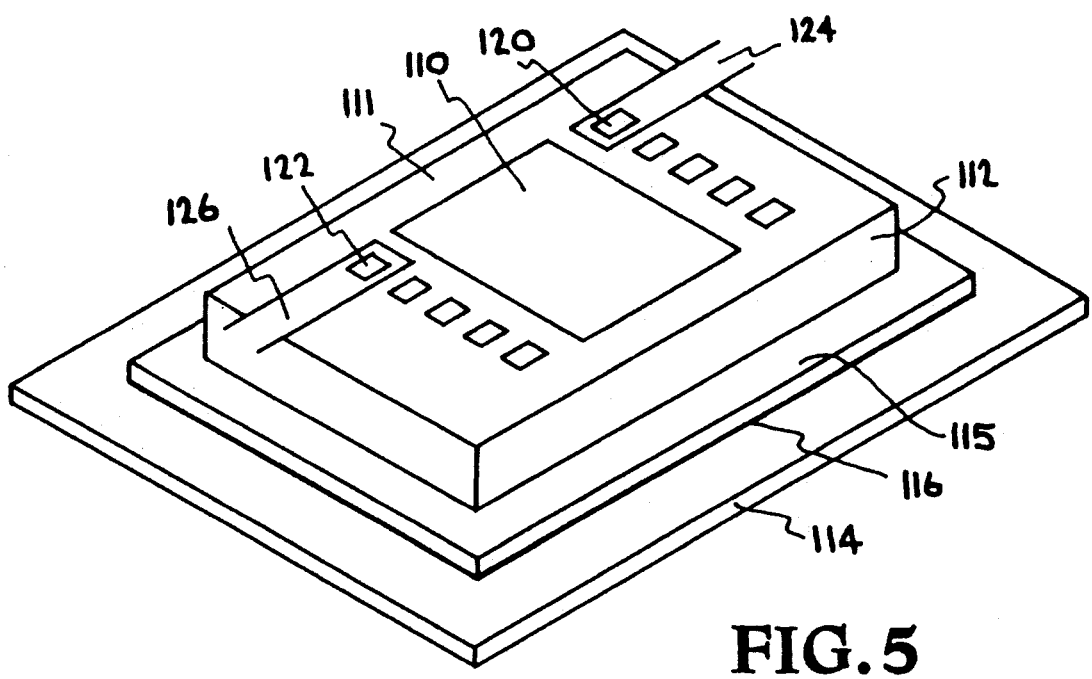
FIG. 5 diagrammatically illustrates an integrated-circuit die and package assembly which, according to the invention, uses a metal VDD layer added to the top surface of the die and a VSS/GND plane in the package to reduce the number of package pins while maintaining good noise performance.

FIG. 5 diagrammatically illustrates an integrated-circuit die and package assembly 100 which, according to the invention, uses a conductive VDD layer 110 formed as the top conducting layer on a suitable underlying insulating layer 111. The conductive layer 110 is formed of metal such as aluminum or other suitable conductive materials known in the art. The insulating layer 111 is formed over at least a portion of a CMOS integrated-circuit chip formed from a semiconductor substrate 112. Both the conductive layer 110 and the insulating layer 111 are formed using conventional semiconductor integrated-circuit fabrication techniques and materials. Note that because steps and various other deviations from plane are found in the surface of the insulating layer 111 underlying the metal VDD layer, the overlying conductive layer 110 can also has similar steps and deviations from planarity. Beneath the top conducting VDD layer and the insulating layer 111 is formed conventional connection layers, such as for example, three-layer metal conductor.

Additionally, a VSS/GND layer 114 is optionally provided as a conductive ground plane which is formed in a pin grid array (PGA) package. As indicated by the simulation result described hereinbelow, this combination of VDD power and VSS ground layers permits an integrated circuit designer to reduce the number of package pins by up to 90 percent while still maintaining good noise performance characteristics. An insulating layer 115 isolates the substrate 112 from the package and is fixed to the PGA package with a conventional gold metallization layer 116.

As previously mentioned, the conductors on the chip and within the package as well as the package pins have inductances, which resonate with increase ground bounce and conducted power-supply noise whenever the various active devices within the integrated circuit are switch states. Consequently, it is desirable to reduce the value of these inductances as much as possible. The invention does this by using the metal VDD layer 110 as a low inductance conductor for supplying VSS voltage to the integrated circuit and the VDD layer 114 in the PGA package for supplying VDD ground voltage to the integrated circuit.

For connection of the integrated circuit chip to a VDD power source, the invention permits the use of a greatly reduced number of wire bonding pads and package pins. FIG. 5 illustrates the use of only two wire-bonding pads which are connected to only two pins in the package using respective tapes 124, 126, as indicated in the drawing.

Figure 6:
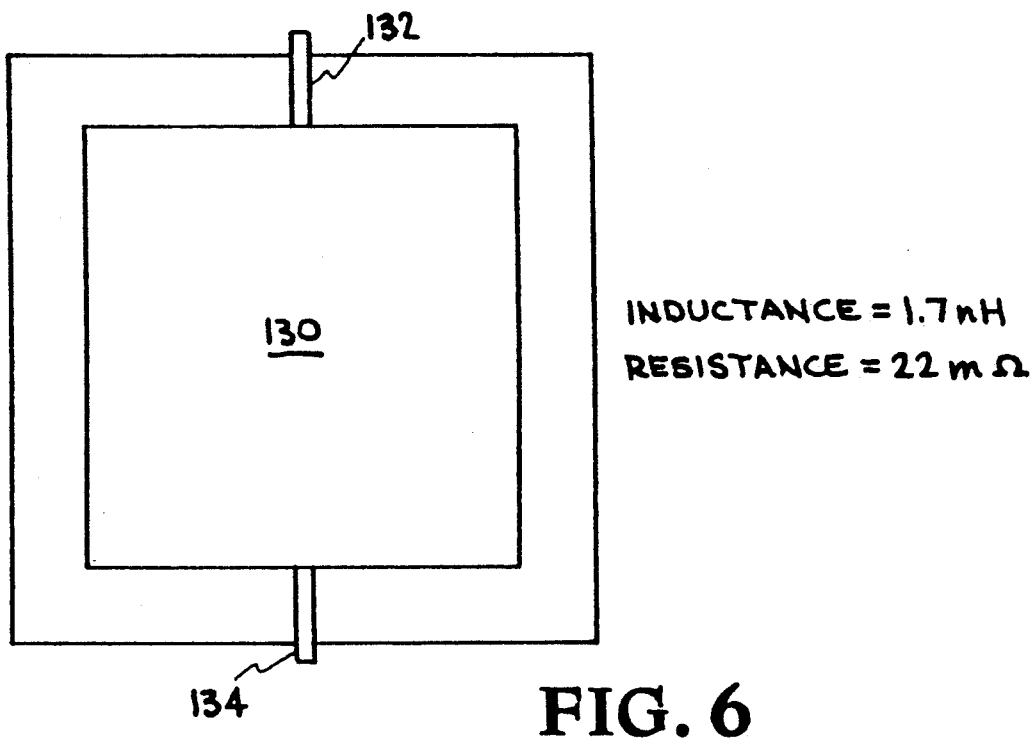
FIG. 6 shows one pattern of the metal VDD layer added to the die of FIG. 4.

FIG. 6 shows one example of a pattern 130 for a metal VDD layer 110 on the integrated-circuit semiconductor substrate 112 of FIG. 4. Respective tabs 134 project from opposite sides of the pattern 130. These tabs are connected to respective bonding pads, similar to the bonding pads 120, 122 of FIG. 4. The inductance of this pattern has been calculated to be 1.7 nanohenrys with a resistance of 22 milliohms.

Figure 7:
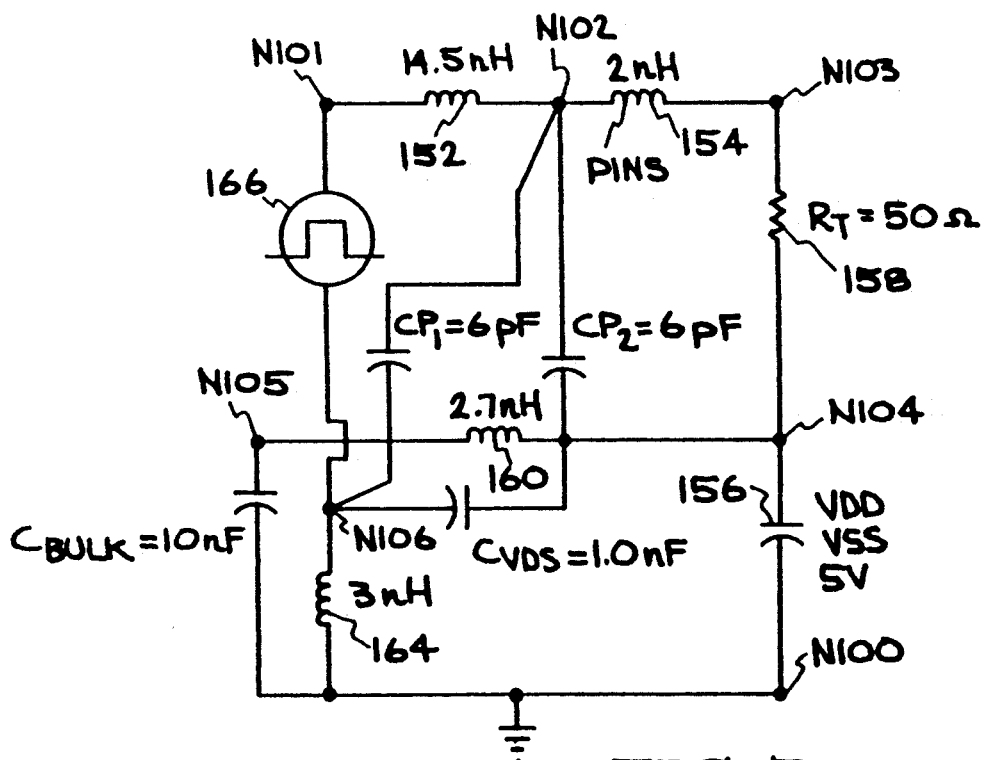
FIG. 7 shows the equivalent circuit of a CMOS integrated-circuit die packaged in a 299-pin high-performance PGA package assembly according to the invention, which uses a metal VDD layer on the die with only 2 VDD pins and 2 VSS pins in the package.

FIG. 7 shows a simulation equivalent circuit of a CMOS integrated-circuit die and a 299-pin high-performance PGA package assembly according to the invention, where the assembly is mounted to a circuit board. This assembly uses a metal VDD layer on the die and only 2 VDD package pins. This assembly also uses a VSS plane in the PGA package and only 2 VSS package pins. For test simulation purposes, the packaged chip is analyzed as being mounted to a test circuit board.

Node N100 represents the external ground terminal on the circuit board. Node N101 represents the bonding pad on the chip for a test signal. Node N102 represents the connection pad on the package for the output signal. An inductance 152, having a value of 14.5 nanohenrys, is shown connected between nodes N101 and N102 and represents the inductance of a 100 mil bonding wire and a single 500 mil wire trace. Node N103 represents the circuit board terminal for the test signal. An inductance 154, having a value of 2 nanohenrys, is connected between nodes N102 and N103 and represents the inductance of a package pin for outputting the test signal. Node N104 represents the connection terminal of the package to the circuit board for a nominal 5 volt VDD voltage provide by an external voltage source 156, which is connected between node N104 and the external ground node N100 of the circuit board. For test purposes a 50 ohm test resistor 158 is shown connected between nodes N103 and N104.

Node N105 represents the bonding pads for VDD on the chip. An inductance 160, having a value of 2.7 nanohenrys, is connected between the nodes N104 and N105 and represents the inductance of the VDD metal layer 110 on the top of the integrated circuit plus the inductance of the 2 package pins for VDD.

Node 106 represents the VSS bonding pads on the chip. An inductance 164 is connected between Nodes N106 and N10 and represents the inductance of the VSS plane in the base of the PGA package plus 2 parallel VSS package pins.

Various capacitances for this prior art chip and package assembly are shown in FIG. 7. These capacitance are physically the same as the capacitances described in connection with FIG. 2 and have the same reference characters. CP1 has a value of 6 picofarads and represents the coupling capacitance between nodes N102 and N106, that is, the capacitance between the bonding pads for the test signal and VSS. CP2 has a value of 6 picofarads and represents the coupling capacitance between nodes N102 and N104, that is, the capacitance between the bonding pads for the test signal and the VDD connection to the circuit board. CBULK has a value of 10 nanofarads and represents the value of the chip substrate capacitance. CVDS has a value of 1 nanofarad and represents the value of the coupling capacitance between the VDD connection to the circuit board and the VSS pads on the chip.

To test the equivalent circuit by simulation of this integrated-circuit chip and package configuration, a simulated test pulse is applied with a pulse generator 166, which is connected between nodes N101 and N106, that is, between the chip output pad for the test signal and the VSS, or chip ground, pads on the chip. The test pulse from test generator 166 for testing this system is the same as show in FIG. 3A. This test pulse has a five volt amplitude, a 10 nanosecond pulse width, a one nanosecond risetime, and a falltime of one nanosecond for testing the ground bounce performance characteristics of the circuit of FIG. 6.

Figure 8:
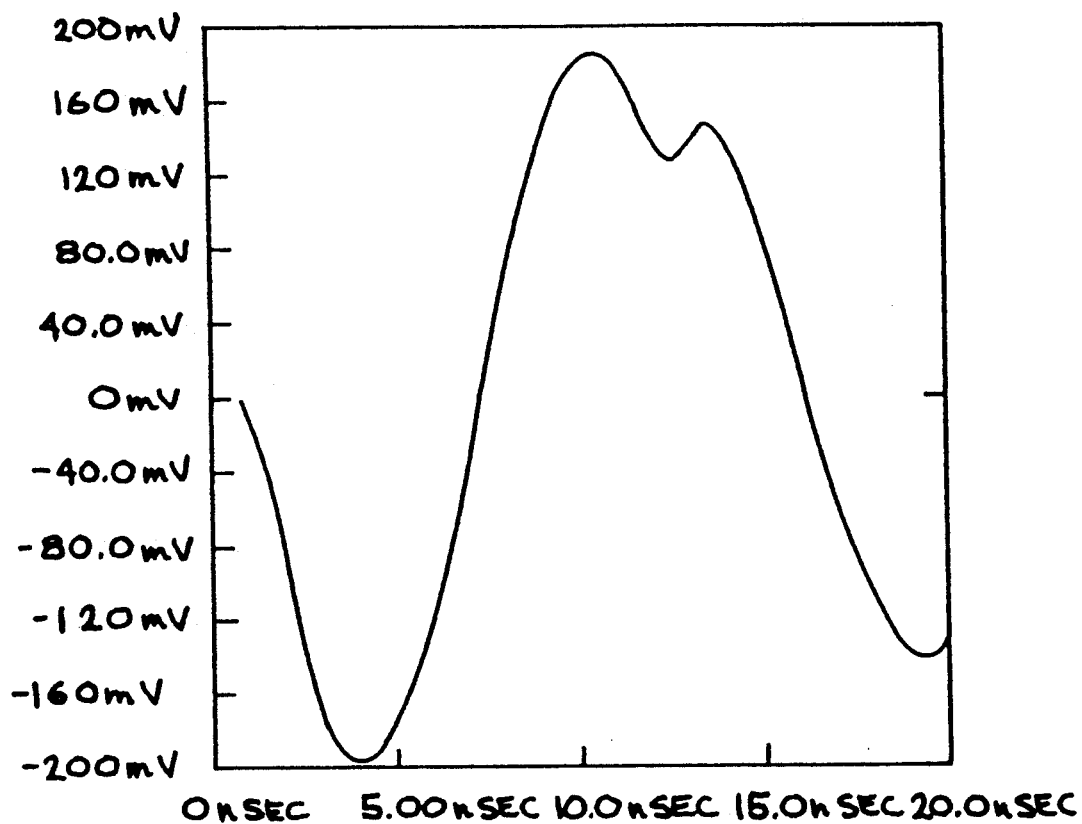
FIG. 8 shows the simulated output response at the integrated-circuit ground node 106 (N106) of FIG. 7 for the simulated input pulse of FIG. 3A.

FIG. 8 shows the ground bounce noise voltage at node N106 for the input test pulse. The peak voltage excursions are approximately 200 millivolts negative and approximately 190 millivolts positive, which provides a groundbounce noise characteristic of less than 5 percent for a five volt test pulse. Note that this performance is obtained with only four package pins and is similar to that obtained using the prior-art 42-package-pin arrangement of FIG. 2.

Figure 9:
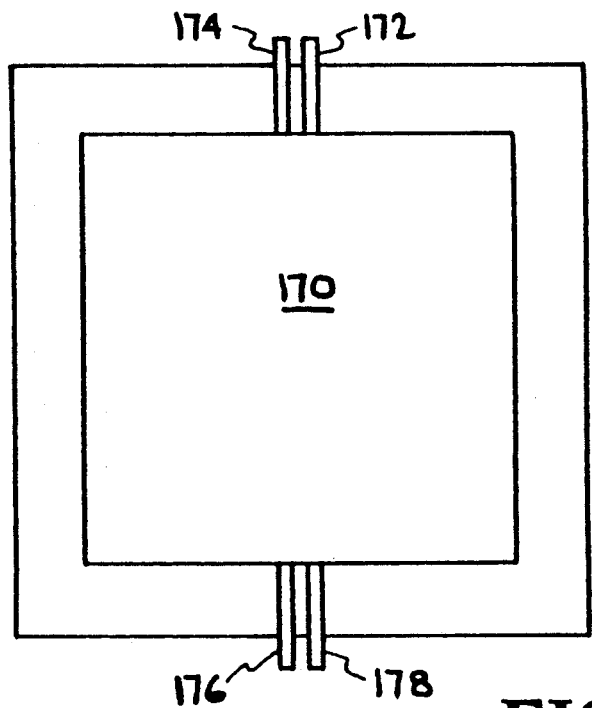
FIG. 9 shows an alternative metal pattern for the metal VDD layer of FIG. 5, where four connecting tabs are provided for wirebonding.

FIG. 9 shows an alternative metal pattern 170 for the metal VDD layer 110 of FIG. 4, where two pairs of connection tabs 172, 174 and 176, 178 are provided for bonding to respective VDD bonding pads.

Figure 10:
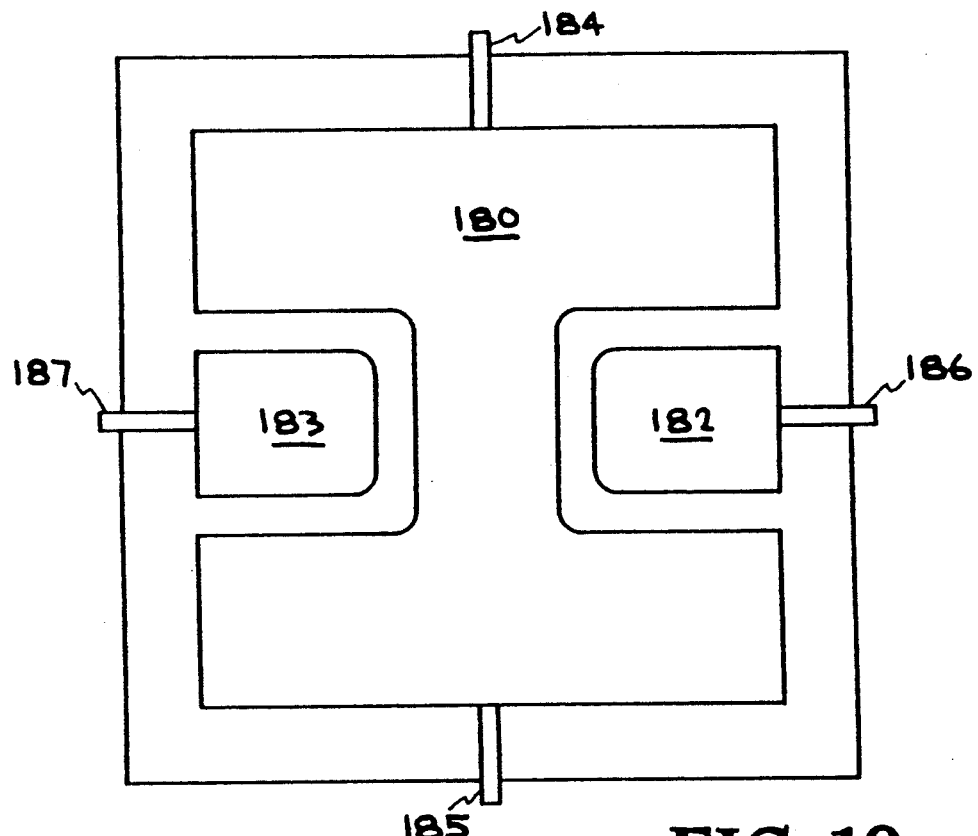
FIG. 10 shows an alternative metal pattern for a metal VDD layer and a second VSS layer added to the top surface of a die.

FIG. 10 shows another alternative conductor, or metal, pattern 180 for a VDD layer on the top of an integrated circuit. This pattern is interleaved on top of the integrated circuit with a complementary pattern 182, 183 for a VSS layer. As indicated in the drawing, both the VSS and the VDD layers are formed as isolated portions of a metal layer formed on top of an integrated circuit chip. Tabs 184, 185 are provided on opposite sides of the pattern 180 for bonding to respective VDD bonding pads. This pattern illustrates the alternative concept of having both the VDD and the VSS layers as parts of the conductive layer formed on top of the integrated circuit chip.

Figure 11:
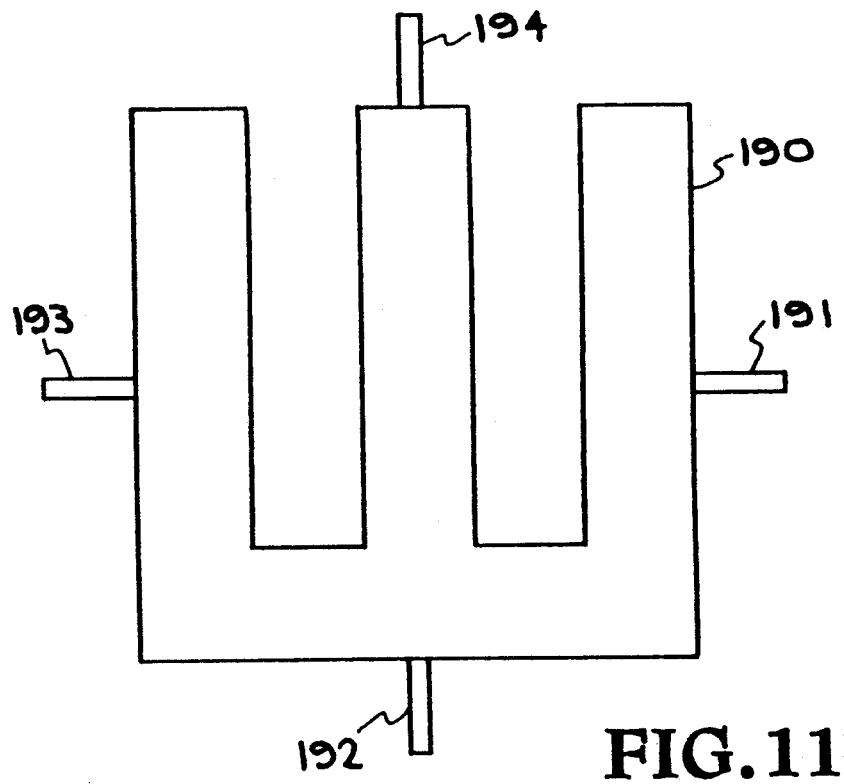
FIG. 11 shows an alternative metal pattern for the added VDD layer of FIG. 5, where portions of the VDD layer are omitted to reduce capacitance between the added VDD layer and adjacent integrated-circuit elements.

FIG. 11 shows another alternative metal or conductor pattern 190 for the VDD layer 110 of FIG. 4, where portions of the layer are omitted as indicated to reduce the capacitance between the VDD layer and integrated circuit elements beneath the cutout portions. Tabs 191, 192, 193, and 194 are provided for bonding to respective VDD bonding pads.

Figure 12:
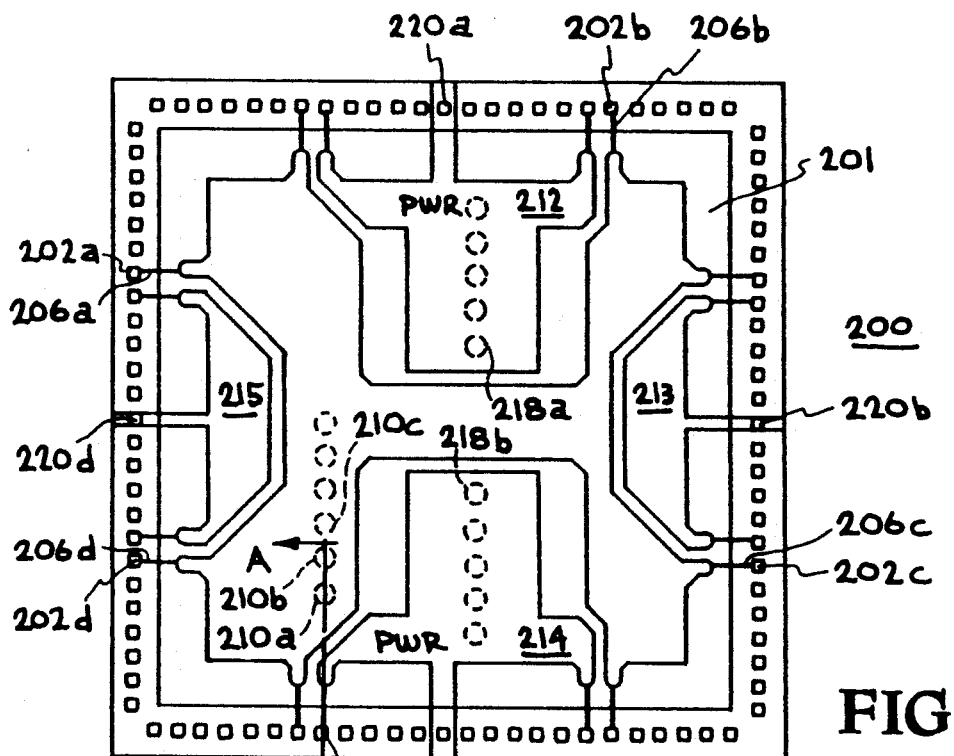
FIG. 12 is a top view of an integrated circuit 200, according to the invention, where relatively large conductive regions are formed over an insulating passivation layer and where the die of this integrated circuit is connected to its package using relatively inexpensive wirebonding.

FIG. 12 is a top view of an integrated circuit 200, according to the invention. Similarly to the flip-chip of FIG. 4, the integrated circuit 200 has relatively large conductive regions formed over an insulating passivation layer 201 formed on the top surface of the integrated circuit. But, unlike the flip-chip, the die of this integrated circuit 200 and its packaging do not require attachment to a package using solder bumps and an expensive package with two conductive layers formed in the package. Rather, the die of this integrated circuit 200 is connected to its package using relatively inexpensive wirebonding. A number of wirebonding pads (typically shown as 202a, 202b, 202c, 202d) are provided for making wirebonded ground connections to a conventional wirebond package. A ground, or VDD, conductive region 204 is formed as an I-shaped conductive region on top of the chip. Connections to the ground pins of the package are made through connection strips (typically shown as 206a, 206b, 206c, 206d) to respective wirebonding ground pads 202a, 202b, 202c, 202d. Connections to internal points within the integrated circuit 200 are made through vias (typically shown as 210a, 210b, 210c).

Various power conducting regions 212, 213, 214, 215 on the passivation layer 201 provide power connections to the integrated circuit through appropriately located vias (typically shown as 218a, 218b). A number of wirebonding pads (typically shown as 220a, 220b, 220c, 220d) are connected to the power conducting regions and are used for making wirebonded power connections to a conventional wirebond package for the respective various power regions.

Figure 13:
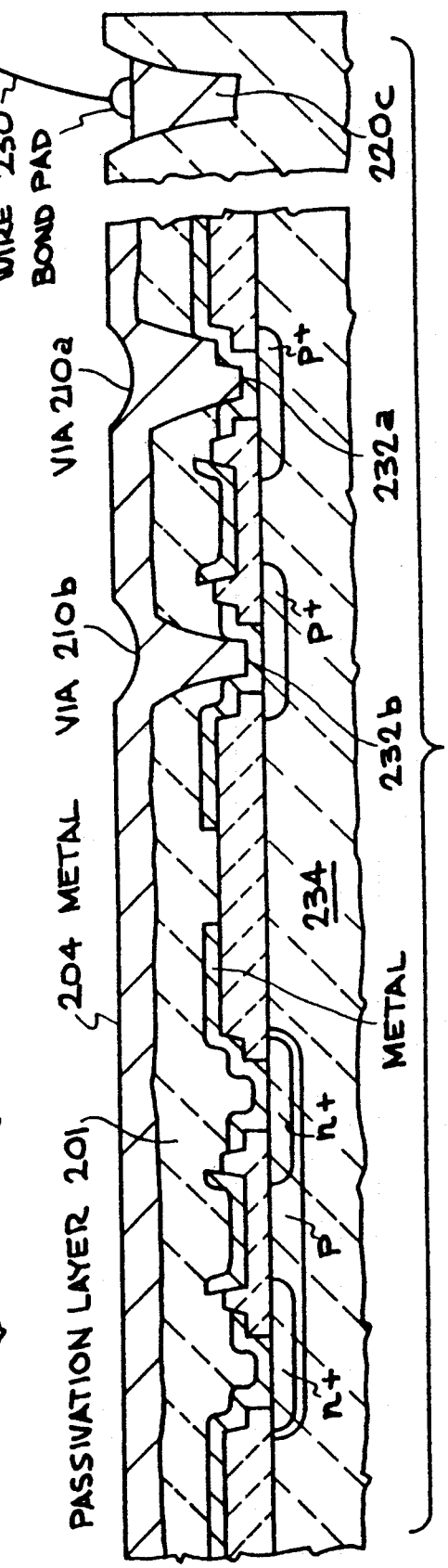
FIG. 13 is a sectional view taken along section line A—A of FIG. 12 and showing details of wirebonding and details of a conductive layer and vias for connecting to internal signal conductors.

FIG. 13 shows a sectional, partial view (not to horizontal scale) taken along the section line A—A of FIG. 12. Near the edge of the integrated circuit is the wirebonding pad 220c, which is shown with a bonding wire 230 attached thereto. A portion of the metal ground region 204 is shown overlying the passivation layer 201. The two vias 210a, 210b are shown making contact to the respective metal lines 232a, 232b of the integrated circuit formed on a silicon substrate 234.

Figure 14:
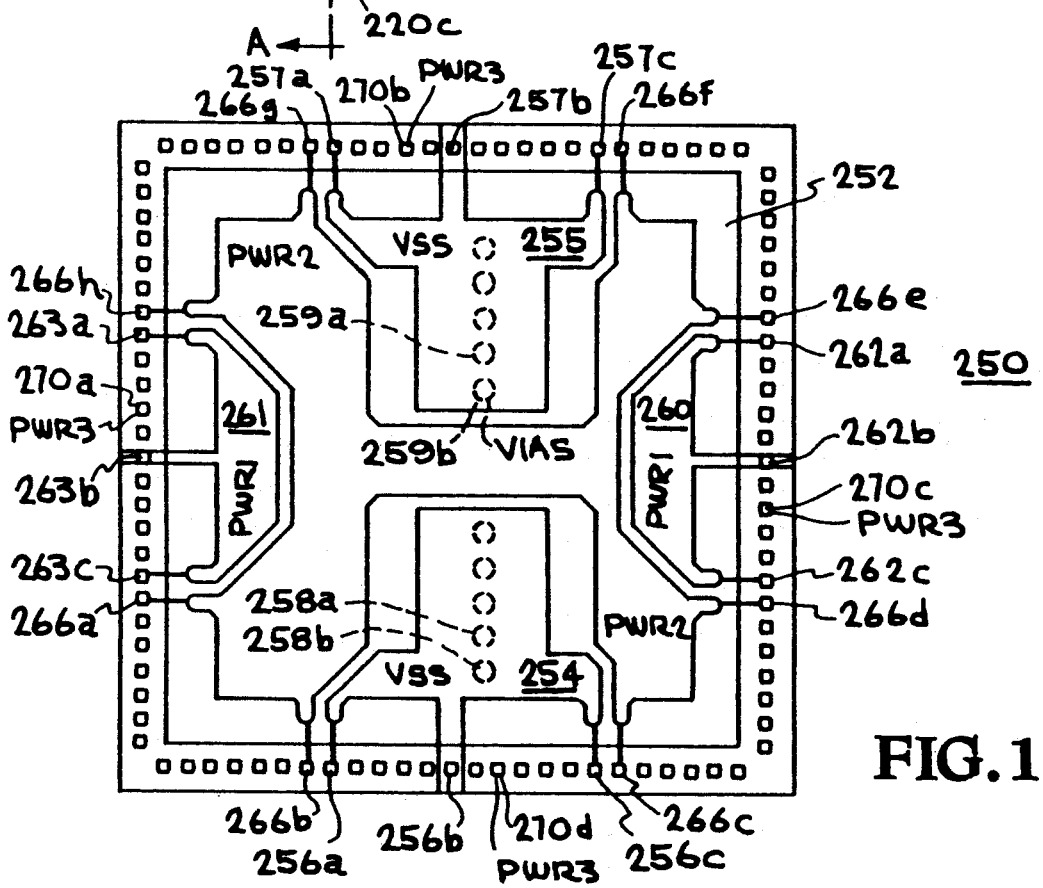
FIG. 14 is a top view of an integrated circuit having various conductive regions assigned to various dedicated power supplies, where connections are provided using wirebonding.

FIG. 14 is a top view of an integrated circuit 250 according to the invention. Connections for various dedicated power supplies are provided using wirebonded connections between the pins of a wirebond package and various low-inductance, conductive regions formed over an insulating passivation layer 252 formed on the top surface of the integrated circuit. Using this technique, separate, dedicated power supplies are provided, for example, for distributing power to core circuits, to I/O circuits, and to noise-sensitive circuits.

One set of these dedicated conductive regions are the VSS power conductive regions 254, 255, which are connected by connection strips to respective sets of wire-bonding pads 256a, 256b, 256c and 257a, 257b, 257c. Connections from the VSS power conductive regions 254, 255 are made through vias (typically shown as 258a, 258b and 259a, 259b), which are similar to the vias 210a, 210b shown in FIG. 13. Similar vias are used with the other dedicated power conductive regions.

Another set of dedicated conductive regions are the PWR1 regions 260, 261, which are connected by connections strips to respective sets of wire-bonding pads 262a, 262b, 262c and 263a, 263b, and 263c. PWR1 regions are used for dedicated, isolated power supplies such as, for example, sensitive logic circuits or analog circuits.

Another set of dedicated conductive regions are the PWR2 regions 264, 265, which are connected to wire-bonding pads 266a-h using connections strips.

External power, which is used for example for I/O circuits, is applied directly to wirebonding pads 270a, 270b, 270c, 207d, which are internally connected to circuits within the integrated circuit.

Figure 15:
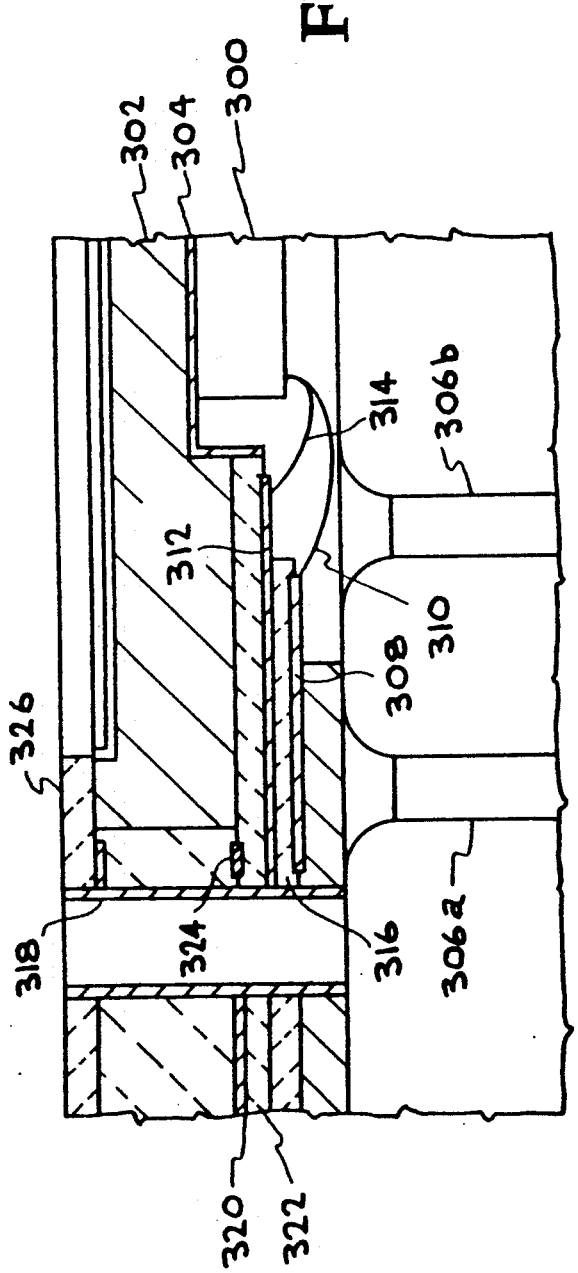
FIG. 15 is an enlarged, detailed cross-sectional view which shows a portion of an integrated circuit die and a portion of its package and which shows wirebonding connections between the die and the package.

FIG. 15 is an enlarged, detailed cross-sectional view of a portion of an integrated circuit die 300 and a portion of its package assembly. The die 300 is mounted to a copper slug 302 using a conventional metallization attachment layer 304. Connection pins, typically shown as 306a, 306b, provide for external connections to the package. These pins extend through the package to its top and are soldered to conductors formed at various levels within the package.

A lower bonding finger 308 is wire-bonded with a wire 310 to a bonding pad on the die 300. The bonding finger 308 is connected through conductors formed in the package to one of the connection pins. An upper bonding finger 312 is wire-bonded with a wire 314 to another bonding pad on the die 300. The lower bonding finger 308 is connected through conductors formed in the package to one of the connection pins. An upper bonding finger 312 is wire-bonded with a wire 314 to another bonding pad on the die 300. The upper and lower bonding fingers 312, 308 are separated by an insulating layer 316.

The upper bonding pad 312 is shown connected to the metal conductor 318 of a plated-through hole. The metal conductor 318 is also connected to a VSS conductive layer 320, which has a relatively large area and is formed on another insulating layer 322. Note that the VDD top metal layer formed on the die 300 according to the invention provides a relatively large conductive area on the die 300 itself. Various signal traces, with one being typically shown as 324 are formed on the insulating layer 322. These signal traces provide for connections between various bonding fingers and external package pins. An insulating layer 326 is formed on the top surface of the package and serves as a solder mask between plated through holes and the connection pins which extend to the top surface of the package.

The foregoing examples of various embodiments of a top metal, or conductive layer formed over an integrated circuit chip illustrate the concept of reducing inductance by eliminating a large number of bonding pads on an integrated circuit with their associated parallel bonding wires and package pins. These various embodiments provide ground bounce noise and conducted power supply noise performance whichis similar to that provided, for example, in a package configuration using an order of magnitude more bonding pads and pins. Consequently, use of the concepts of the invention results in reduced cost because the invention provides for reduced die size and smaller packages, while still maintaining acceptable performance characteristics.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

I claim:

1. A method of providing power to an integrated circuit, comprising the steps of:

forming an insulating layer on at least a portion of a semiconductor die, on which integrated circuit elements and a plurality of wirebonding pads are formed;

forming a power-distribution conducting layer on said insulating layer, said conducting layer formed to have lateral dimensions significantly greater than the line width of a signal conductor formed on said semiconductor die, forming said conducting layer as a single conducting region, which is connected to one or more wirebonding pads on said semiconductor die, which extends over a substantial area of the semiconductor die, and which has an inductance significantly less than the inductance of one of said signal conductors, said conducting layer providing a connection for a first voltage reference source to a first selected region of said integrated circuit;

mounting the semiconductor die in a wirebond package, which has external connection pins mounted thereto; and electrically connecting the external connection pins of said wirebonding package to selected ones of said wirebonding pads by connecting including bonding wires to wirebond pads on said semiconductor die.

2. The method of claim 1 including the step of connecting the conducting layer with conductive strips to respective wirebonding pads on the semiconductor die.

3. The method of claim 1 including the step of connecting with conductive vias the conducting layer to points within the circuits formed on said semiconductor die.

4. A method of providing power to an integrated circuit, comprising the steps of:

forming an insulating layer on at least a portion of a semiconductor die, on which integrated circuit elements and a plurality of wirebonding pads are formed;

forming a first conducting layer on said insulating layer, said first conducting layer formed to have lateral dimensions significantly greater than the line width of a signal conductor formed on said semiconductor die, forming said first conducting layer as a single conducting region, which is connected to one or more wirebonding pads on said semiconductor die, which extends over a substantial area of the semiconductor die, and which has an inductance significantly less than the inductance of one of said signal conductors, said first conducting layer providing a connection for a first voltage reference source to a first selected region of said integrated circuit;

forming a second conducting layer on said insulating layer, said second conducting layer having lateral dimensions significantly greater than the line width of the signal conductors formed on said semiconductor die, forming said second conducting layer as a single conducting region which extends over a substantial area of said semiconductor substrate and which has an inductance significantly less than the inductance of an interconnection conductor, said first conducting layer providing a connection for a second voltage reference source to a second selected region of said integrated circuit;

mounting the semiconductor die in a wirebond package, which has external connection pins mounted thereto; and electrically connecting the external connection pins of said wirebonding package to selected ones of said wirebonding pads by connecting means including bonding wires to wirebond pads on said semiconductor die.

5. The method of claim 4 including the step of connecting the first and the second conducting layers with conductive strips to respective wirebonding pads on the semiconductor die.

6. The method of claim 4 including the step of connecting with conductive vias the first and the second conducting layers to points within the circuits formed on said semiconductor die.

* * * * *